(12) United States Patent
Fujisawa et al.

(10) Patent No.: US 9,163,324 B2
(45) Date of Patent: Oct. 20, 2015

(54) METHOD FOR PRODUCING NITRIDE CRYSTAL

(75) Inventors: Hideo Fujisawa, Ibaraki (JP); Yutaka Mikawa, Ibaraki (JP); Kazunori Kamada, Ibaraki (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 518 days.

(21) Appl. No.: 13/427,058

(22) Filed: Mar. 22, 2012

(65) Prior Publication Data

US 2012/0251431 A1 Oct. 4, 2012

Related U.S. Application Data

(60) Provisional application No. 61/466,154, filed on Mar. 22, 2011, provisional application No. 61/513,270, filed on Jul. 29, 2011.

(51) Int. Cl.
*C30B 7/10* (2006.01)
*C30B 29/40* (2006.01)

(52) U.S. Cl.
CPC . *C30B 7/10* (2013.01); *C30B 7/105* (2013.01); *C30B 29/403* (2013.01); *C30B 29/406* (2013.01)

(58) Field of Classification Search
None
See application file for complete search history.

(56) References Cited

U.S. PATENT DOCUMENTS

| | | | |
|---|---|---|---|
| 7,859,008 B2 | 12/2010 | D'Evelyn et al. | |
| 2003/0183155 A1* | 10/2003 | D'Evelyn et al. | 117/68 |
| 2004/0124434 A1 | 7/2004 | D'Evelyn et al. | |
| 2004/0124435 A1 | 7/2004 | D'Evelyn et al. | |
| 2005/0098095 A1 | 5/2005 | D'Evelyn et al. | |
| 2006/0169996 A1 | 8/2006 | D'Evelyn et al. | |
| 2007/0040181 A1 | 2/2007 | D'Evelyn et al. | |
| 2007/0158785 A1* | 7/2007 | D'Evelyn et al. | 257/615 |
| 2007/0215887 A1 | 9/2007 | D'Evelyn et al. | |
| 2008/0006844 A1* | 1/2008 | D'Evelyn et al. | 257/103 |
| 2008/0008855 A1 | 1/2008 | D'Evelyn et al. | |
| 2010/0003492 A1 | 1/2010 | D'Evelyn | |
| 2010/0111808 A1* | 5/2010 | Pimputkar et al. | 423/409 |

(Continued)

FOREIGN PATENT DOCUMENTS

| | | | |
|---|---|---|---|
| JP | 2004-2152 A | | 1/2004 |
| JP | 2004002152 A | * | 1/2004 |
| JP | 2006-513122 A | | 4/2006 |

(Continued)

OTHER PUBLICATIONS

International Search Report and Written Opinion issued May 15, 2012 in PCT/JP2012/057085 filed Mar. 21, 2012.

(Continued)

*Primary Examiner* — Guinever S Gregorio
(74) *Attorney, Agent, or Firm* — Oblon, McClelland, Maier & Neustadt, L.L.P.

(57) ABSTRACT

A method for producing a nitride crystal, comprising growing a nitride crystal on the surface of a seed crystal put in a reactor while the temperature and the pressure inside the reactor that contains, as put thereinto, a seed crystal having a hexagonal-system crystal structure, a nitrogen-containing solvent, a starting material, and a mineralizing agent containing fluorine and at least one halogen element selected from chlorine, bromine and iodine are so controlled that the solvent therein could be in a supercritical state and/or a subcritical state to thereby grow a nitride crystal on the surface of the seed crystal in the reactor.

18 Claims, 2 Drawing Sheets

(56) References Cited

U.S. PATENT DOCUMENTS

2011/0150686 A1    6/2011    Trushin et al.
2011/0268645 A1*  11/2011  Mikawa et al. ............... 423/409

FOREIGN PATENT DOCUMENTS

| JP | 2007-509507 A | 4/2007 |
|---|---|---|
| JP | 2007-169075 A | 7/2007 |
| JP | 2008-120672 A | 5/2008 |
| JP | 2008-143778 A | 6/2008 |
| JP | 2010-509178 A | 3/2010 |
| JP | 2011-68545 A | 4/2011 |
| WO | WO 2004/061923 A1 | 7/2004 |
| WO | WO 2005/043638 A1 | 5/2005 |
| WO | WO 2008/063444 A2 | 5/2008 |
| WO | WO 2008/063444 A3 | 5/2008 |

OTHER PUBLICATIONS

Yu-Shiang Wu, et al., "Structure of nanocrystalline ammonothermal GaN in dependence of temperature and type of acidic mineralizer", Journal of Crystal Growth 310, 2008, pp. 2800-2805.
U.S. Appl. No. 13/661,090, filed Oct. 26, 2012, Mikawa, et al.
Extended Search Report issued Apr. 3, 2014 in European Patent Application No. 12760676.2.
Combined International Preliminary Report on Patentability and Written Opinion of the International Searching Authority issued Sep. 24, 2013 in PCT/JP2012/057085 (with English language translation).
U.S. Appl. No. 13/481,989, filed May 29, 2012, Mikawa, et al.

\* cited by examiner

METHOD FOR PRODUCING NITRIDE CRYSTAL

CROSS-REFERENCE TO RELATED APPLICATIONS

The present application claims the benefit of U.S. Provisional Patent Application No. 61/466,154, filed Mar. 22, 2011 and U.S. Provisional Patent Application No. 61/513,270, filed Jul. 29, 2011.

BACKGROUND OF THE INVENTION

1. Field of the Invention

The present invention relates to a method for producing a nitride crystal, especially to a method for producing a nitride crystal through growth of a nitride crystal according to an ammonothermal process using a mineralizing agent that contains multiple types of halogen elements.

2. Description of the Related Art

An ammonothermal method is a method for producing a desired material using a nitrogen-containing solvent such as ammonia or the like in a supercritical state and/or a subcritical state and utilizing the dissolution-precipitation reaction of the starting material therein. In the method, when applied to crystal growth, a supersaturation state is generated through the temperature difference based on the temperature dependence of the solubility of the starting material in the solvent such as ammonia or the like, thereby precipitating a crystal. In a hydrothermal method similar to the ammonothermal method, water in a supercritical and/or subcritical state is used as the solvent for crystal growth, and the method is applied mainly to a crystal of oxide such as quartz ($SiO_2$), zinc oxide (ZnO) or the like. On the other hand, the ammonothermal method is applicable to a nitride crystal, and is utilized for growth of a crystal of nitride such as gallium nitride or the like.

Gallium nitride crystal growth according to the ammonothermal method is a reaction in a supercritical solvent environment at high temperature and high pressure (500° C. or higher, 150 MPa or more), and in addition, the solubility of gallium nitride in a solvent such as pure ammonia or the like in a supercritical state is extremely low, and therefore, it is known to add an ammonium halide or the like as a mineralizing agent for the purpose of increasing the solubility and promoting the crystal growth. For example, Patent Reference 1 and Patent Reference 2 describe use of ammonium fluoride, ammonium chloride, ammonium bromide or ammonium iodide as a mineralizing agent.

On the other hand, it is known that, when gallium nitride is grown using an iodine-containing mineralizing agent or a bromine-containing mineralizing agent, then hexagonal-system gallium nitride crystals that differ in the crystal structure may tend to be formed, and it is suggested that these mineralizing agents are unsuitable to growth of useful hexagonal-system gallium nitride (Non-Patent Reference 1).

CITATION LIST

Patent References

[Patent Reference 1] U.S. Pat. No. 7,859,008
[Patent Reference 2] JP-A 2008-120672

Non-Patent Reference

[Non-Patent Reference 1] Journal of Crystal Growth 310 (2008) 2800-2805

SUMMARY OF THE INVENTION

As a result of the investigations made by the present inventors, it has been clarified that, in case where a nitride crystal is grown on the surface of a seed crystal having a hexagonal-system crystal structure and when, for example, ammonium chloride is used alone as the mineralizing agent, then the growth rate in the m-axis direction and the a-axis direction is low and therefore, it is difficult to obtain efficiently a good M-plane crystal or to enlarge the C-plane.

In addition, it has been clarified that, when ammonium bromide or ammonium iodide is used alone, the growth rate of the C-plane alone is high but the growth rate of the other directions is low, and therefore a needle-like crystal extending in the c-axis direction tends to be obtained but a large-sized and good-quality crystal could not be obtained. Further, in the case where ammonium bromide or ammonium iodide is used, the solubility curve inclination is larger than in the case where ammonium chloride is used. In other words, only a small change in temperature difference brings about a substantial change in supersaturation, and therefore accurate temperature control is required but the control is difficult thereby bringing about a problem of spontaneous nucleation. In addition, the nitride crystal grown by the use of such a mineralizing agent has another problem in that the halogen concentration therein is high.

On the other hand, in case where ammonium fluoride is used alone as a mineralizing agent, the solubility of the starting material such as gallium nitride or the like has a negative correlation with temperature, and therefore temperature and pressure control is troublesome, often causing seed crystal dissolution and spontaneous nucleation. In addition, as described in Patent Reference 1, crystal growth may occur at high temperature and under high pressure, for example, at 700° C. or more and under 500 MPa or more, therefore requiring an apparatus excellent in heat resistance and pressure resistance and providing a problem in point of process safety and cost.

In consideration of these problems with the related art, the present inventors have further made assiduous studies for the purpose of providing a method for producing a nitride crystal, in which the growth rate in the m-axis and a-axis directions is high as compared with that in the case where ammonium chloride, ammonium bromide or ammonium iodide is used alone, and which enables crystal growth in a simplified manner under lower temperature and pressure conditions than in the case where ammonium bromide is used alone, and is advantageous in point of process safety and cost.

As a result of assiduous studies, the present inventors have found that, when a nitride crystal is grown according to an ammonothermal process using a mineralizing agent that contains fluorine and other halogen elements, then the above-mentioned problems can be solved, therefore providing the present invention as described below.

[1] A method for producing a nitride crystal, comprising growing a nitride crystal on the surface of a seed crystal put in a reactor while the temperature and the pressure inside the reactor that contains, as put thereinto, a seed crystal having a hexagonal-system crystal structure, a nitrogen-containing solvent, a starting material, and a mineralizing agent containing fluorine and at least one halogen element selected from chlorine, bromine and iodine are so controlled that the solvent

[2] The method for producing a nitride crystal of [1], wherein the mineralizing agent contains chlorine and fluorine.
[3] The method for producing a nitride crystal of [2], wherein the chlorine concentration in the mineralizing agent is from 1 to 200 molar times the fluorine concentration therein.
[4] The method for producing a nitride crystal of any one of [1] to [3], wherein the mineralizing agent contains bromine and fluorine.
[5] The method for producing a nitride crystal of [4], wherein the bromine concentration in the mineralizing agent is from 0.1 to 100 molar times the fluorine concentration therein.
[6] The method for producing a nitride crystal of any one of [1] to [5], wherein the mineralizing agent contains iodine and fluorine.
[7] The method for producing a nitride crystal of [6], wherein the iodine concentration in the mineralizing agent is from 0.1 to 100 molar times the fluorine concentration therein.
[8] The method for producing a nitride crystal of any one of [1] to [7], wherein the total molar amount of the halogen elements contained in the mineralizing agent is from 0.1 to 30 mol % of the molar amount of the nitrogen-containing solvent.
[9] The method for producing a nitride crystal of any one of [1] to [8], wherein the temperature of the region in which the starting material is melted inside the reactor (starting material melting region) is higher than the temperature of the region in which the nitride crystal is grown on the surface of the seed crystal (crystal growth region).
[10] The method for producing a nitride crystal of any one of [1] to [9], wherein the temperature inside the reactor in the growing the nitride crystal is from 500 to 650° C.
[11] The method for producing a nitride crystal of any one of [1] to [10], wherein the pressure under which the nitride crystal is grown is from 120 to 350 MPa.
[12] The method for producing a nitride crystal of any one of [1] to [11], wherein the nitride crystal is a crystal of a nitride of a Group 13 metal in the Periodic Table.
[13] The method for producing a nitride crystal of [12], wherein the growth rate of the M-plane is at least 3 times the growth rate of the Periodic Table Group 13 metal plane.
[14] The method for producing a nitride crystal of [12] or [13], wherein the growth rate of the M-plane is at least 0.4 times the growth rate of the C-plane.
[15] The method for producing a nitride crystal of any one of [12] to [14], wherein the growth rate of the A-plane is at least 0.6 times the growth rate of the C-plane.
[16] The method for producing a nitride crystal of any one of [12] to [14], wherein the growth rate of the A-plane is at least 1.5 times the growth rate of the C-plane.
[17] The method for producing a nitride crystal of any one of [12] to [16], wherein the growth rate of the Periodic Table Group 13 metal plane is from 10 to 150 μm/day.
[18] The method for producing a nitride crystal of any one of [12] to [17], wherein the growth rate of the M-plane is from 100 to 500 μm/day.
[19] The method for producing a nitride crystal of any one of [12] to [18], wherein the growth rate of the A-plane is from 100 to 2500 μm/day.
[20] The method for producing a nitride crystal of any one of [12] to [19], wherein the growth rate of the N-plane is from 100 to 1000 μm/day.
[21] A nitride crystal produced according to the production method of any one of [1] to [20].
[22] The nitride crystal of [21], wherein the fluorine concentration is from $5 \times 10^{15}$ to $1 \times 10^{18}$ atoms/cm$^{-3}$.
[23] The nitride crystal of [21] or [22], wherein the total concentration of chlorine, bromine and iodine is at most $1 \times 10^{18}$ atoms/cm$^{-3}$.
[24] The nitride crystal of any one of [21] to [23], which is a Periodic Table Group 13 metal nitride crystal.
[25] The nitride crystal of [24], wherein the major plane is the C-plane and the X-ray diffractiometry half-value width in reflection on the (0002) plane is at most 150 arcsec.
[26] The nitride crystal of [24], wherein the major plane is the M-plane and the X-ray diffractiometry half-value width in reflection on the (10-10) plane is at most 150 arcsec.

According to the production method of the invention, the growth rate in the m-axis and a-axis directions is higher than in the case where a halogen element-containing mineralizing agent such as ammonium chloride, ammonium bromide or ammonium iodide is used alone, and therefore a good-quality nitride crystal in which the M-plane is the major plane thereof or a good-quality nitride crystal in which the A-plane is the major plane thereof can be produced efficiently. In addition, it is also possible to efficiently produce a large-sized and good-quality nitride crystal in which the C-plane is the major plane thereof. For example, when ammonium bromide or ammonium iodide is used alone, then a needle-like nitride crystal tends to be formed along with much spontaneous nucleation; however, according to the production method of the invention, a flat and high-quality nitride crystal can be readily and efficiently produced. In addition, according to the production method of the invention, crystal growth can be attained in a more simplified manner under lower temperature and pressure conditions than in the case of using a mineralizing agent alone that contains fluorine alone as a halogen element therein, such as ammonium fluoride, and therefore, a nitride crystal can be produced advantageously in point of the process safety and the cost. Further, according to the production method of the invention, the solubility can be so controlled as to have a positive correlation with temperature, contrary to that in the case of using a mineralizing agent alone that contains fluorine alone as a halogen element therein. Consequently, according to the production method of the invention, the halogen concentration in the nitride crystal to be produced can be suppressed low.

BRIEF DESCRIPTION OF DRAWINGS

FIG. 3 is a schematic view of another crystal production apparatus usable in the invention.
In the drawings, 1 is autoclave, 2 is inner surface of autoclave, 3 is lining, 4 is inner surface of lining, 5 is baffle plate, 6 is crystal growing region, 7 is seed crystal, 8 is starting material, 9 is starting material melting region, 10 is valve, 11 is vacuum pump, 12 is ammonia gas cylinder, 13 is nitrogen cylinder, 14 is mass flow meter, 20 is capsule, and 21 is inner surface of capsule.

MODES FOR CARRYING OUT THE INVENTION

Figure 1:
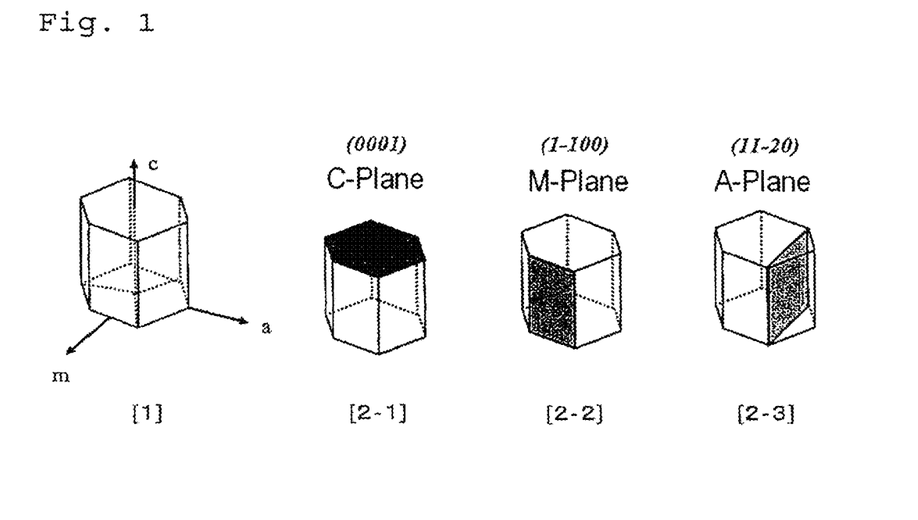
FIG. 1 is to explain the axes and the planes constituting a hexagonal-system crystal structure.

The production method for a nitride crystal of the invention, and the crystal production apparatus and its constituent members for use for the method are described in detail hereinunder. The description of the constituent elements given hereinunder is for some typical embodiments of the invention, to which, however, the invention should not be limited. The c-axis, the m-axis and the a-axis used in describing the hexagonal-system crystal structure in this description each indicate the axial directions shown in FIG. 1-[1]; the C-plane indicates the {0001} plane shown in FIG. 1-[2-1] (the drawing shows +C-plane); the M-plane indicates the (1-100) plane and its equivalent plane, {1-100} plane shown in FIG. 1-[2-2]; and the A-plane indicates the (1-120) plane and its equivalent plane, {1-120} plane shown in FIG. 1-[2-3]. In this description, the numerical range expressed by the wording "a number to another number" means the range that falls between the former number indicating the lower limit of the range and the latter number indicating the upper limit thereof.

The growth rate of C-plane, the growth rate of M-plane and the growth rate of A-plane used in this description each indicate the growth rate in the c-axial direction, the m-axial direction and the a-axis direction of a seed.

(Mineralizing Agent)

The production method for a nitride crystal of the invention includes a step of growing a nitride crystal on the surface of a seed crystal put in a reactor while the temperature and the pressure inside the reactor that contains, as put thereinto, a seed crystal having a hexagonal-system crystal structure, a nitrogen-containing solvent, a starting material, and a mineralizing agent are so controlled that the solvent therein could be in a supercritical state and/or a subcritical state to thereby grow a nitride crystal on the surface of the seed crystal in the reactor. The production method of the invention is characterized in that the mineralizing agent to be used therein contains fluorine and at least one halogen elements selected from chloride, bromine and iodine.

The combination of the halogen elements to be contained in the mineralizing agent for use in the invention may be a combination of two elements of chlorine and bromine, bromine and fluorine, or iodine and chlorine, or may be a combination of three elements of chlorine, bromine and fluorine; chlorine, iodine and fluorine; or bromine, iodine and fluorine, or may be a combination of four elements of chlorine, bromine, iodine and fluorine. Preferred are a combination containing at least chlorine and fluorine; a combination containing at least bromine and fluorine; and a combination containing at least iodine and fluorine. The combination of the halogen elements to be contained in the mineralizing agent for use in the invention and the concentration ratio (molar concentration ratio) thereof may be suitably defined depending on the type, the shape and the size of the nitride crystal to be grown, the type, the shape and the size of the seed crystal to be used, the reaction apparatus to be used, and the temperature condition and the pressure condition to be employed, etc.

For example, in a case of a mineralizing agent that contains chlorine and fluorine, preferably, the chlorine concentration is at least 1 time the fluorine concentration therein, more preferably at least 5 times, even more preferably at least 10 times. Also preferably, the chlorine concentration in the agent is at most 200 times the fluorine concentration therein, more preferably at most 100 times, even more preferably at most 50 times.

For example, in a case of a mineralizing agent that contains bromine and fluorine, preferably, the bromine concentration is at least 0.1 times the fluorine concentration therein, more preferably at least 0.5 times, even more preferably at least 1 time. Also preferably, the bromine concentration in the agent is at most 100 times the fluorine concentration therein, more preferably at most 50 times, even more preferably at most 20 times.

For example, in a case of a mineralizing agent that contains iodine and fluorine, preferably, the iodine concentration is at least 0.1 times the fluorine concentration therein, more preferably at least 0.5 times, even more preferably at least 1 time. Also preferably, the iodine concentration in the agent is at most 100 times the fluorine concentration therein, more preferably at most 50 times, even more preferably at most 20 times.

In general, when the fluorine concentration in the mineralizing agent is increased, the growth rate of the M-plane and the A-plane of the nitride crystal tends to be higher, and the growth rate of the C-plane therefore tends to be relatively lower. In case where the fluorine concentration is increased further more, the solubility of the starting material comes to have a negative correlation with temperature and therefore the crystal growth may occur in a high-temperature region. On the other hand, in case where the chlorine concentration, the bromine concentration and the iodine concentration in the mineralizing agent are increased, the solubility of the starting material comes to have a stronger positive correlation with temperature and the growth rate of the C-plane tends to be relatively higher. This tendency may be stronger in the order of chlorine, bromine and iodine.

Examples of the halogen element-containing mineralizing agent include ammonium halides, hydrogen halides, ammonium hexahalosilicates, hydrocarbylammonium fluoride, as well as alkylammonium salts such as tetramethylammonium halides, tetraethylammonium halides, benzyltrimethylammonium halides, dipropylammonium halides, isopropylammonium halides, etc.; alkyl-metal halides such as alkylsodium halides; and alkaline earth metal halides, metal halides, etc. Of those, preferred are alkali halides, alkaline earth metal halides, metal halides, ammonium halides and hydrogen halides that are halogen element-containing additives (mineralizing agents); more preferred are alkali halides, ammonium halides, halides of a Group 13 metal of the Periodic Table, and hydrogen halides; and even more preferred are ammonium halides, gallium halides, and hydrogen halides.

A halogen element-free mineralizing agent may be combined with the halogen element-containing mineralizing agent for use in the invention; and for example, the halogen element-containing mineralizing agent may be combined with an alkali metal halide such as $NaNH_2$, $KNH_2$, $LiNH_2$, etc. In case where halogen element-containing mineralizing agent such as an ammonium halide or the like is combined with a mineralizing agent that contains an alkali metal element or an alkaline earth metal element for use in the invention, preferably, the amount of the halogen element-containing mineralizing agent is larger. Concretely, preferably, the amount of the alkali metal element or alkaline earth metal element-containing mineralizing agent is from 50 to 0.01 parts by weight relative to 100 parts by weight of the halogen element-containing mineralizing agent, more preferably from 20 to 0.1 parts by weight, even more preferably from 5 to 0.2 parts by weight. Adding the alkali metal element or alkaline earth metal element-containing mineralizing agent can markedly increase the ratio of the crystal growth rate in the m-axial direction to the crystal growth rate in the c-axial direction (m-axis/c-axis).

For protecting the nitride crystal to be grown in the invention from being contaminated with impurities, if desired, the mineralizing agent may be used after purified and dried. The purity of the mineralizing agent for use in the invention is generally at least 95% but preferably at least 99%, more preferably at least 99.99%. Preferably, the amount of water and oxygen to be contained in the mineralizing agent is as small as possible, and preferably, the content thereof is at most 1000 ppm, more preferably at most 10 ppm, even more preferably at most 1.0 ppm.

In crystal growth according to the invention, an aluminium halide, a phosphorus halide, a silicon halide, a germanium halide, a zinc halide, an arsenic halide, a tin halide, an antimony halide, a bismuth halide or the like may exist in the reactor.

The molar concentration of the halogen element contained in the mineralizing agent is, relative to the solvent, preferably at least 0.1 mol %, more preferably at least 0.3 mol %, even more preferably at least 0.5 mol %. Also preferably, the molar concentration of the halogen element contained in the mineralizing agent is, relative to the solvent, at most 30 mol %, more preferably at most 20 mol %, even more preferably at most mol %. When the concentration is too low, then the solubility may lower and the growth rate may tend to lower. On the other hand, when the concentration is too high, then the solubility may increase too much and the spontaneous nucleation may therefore increase, or the degree of supersaturation may increase too much and the process control may tend to be difficult.

(Seed Crystal)

In the invention, a seed crystal having a hexagonal-system crystal structure is used. Preferably, the seed crystal is a single crystal of a nitride grown according to the production method of the invention; however, the seed crystal is not always required to be the same as the crystal to be grown in the invention. In such a case, however, it is necessary that the seed crystal has a lattice constant or crystal lattice size parameter same as or corresponding to that of the intended nitride, or the seed crystal is composed of a monocrystalline material piece or a polycrystalline material piece so coordinated as to guarantee heteroepitaxy (that is, sameness in the crystallographic position of some atoms). Specific examples of the seed crystal include, for example, a single crystal of GaN in a case of growing gallium nitride (GaN), as well as a nitride single crystal of aluminium nitride (AlN), etc., a single crystal of zinc oxide (ZnO), a single crystal of silicon carbide (SiC), sapphire ($Al_2O_3$), etc.

The seed crystal can be decided in consideration of the solubility thereof in solvent and the reactivity thereof with mineralizing agent. For example, as a seed crystal for GaN, employable here is a single crystal obtained through epitaxial growth on a heterogeneous substrate such as sapphire or the like according to an MOCVD process or an HVPE process followed by peeling; a single crystal obtained through growth from a metal Ga with a flux of Na, Li or Bi, a single crystal homo/hetero-epitaxially grown according to an LPE process, a single crystal produced according to an ammonothermal process, or a crystal prepared by cutting them.

The major plane of the seed crystal for use in the invention is not specifically defined. The major plane as referred to herein means the plane having the largest area of the planes constituting the crystal. In the invention, for example, usable are a seed crystal in which the major plane is the C-plane, a seed crystal in which the major plane is the M-plane, a seed crystal in which the major plane is the A-plane, and a seed crystal in which the semipolar plane is the major plane. The major plane may be formed through cleavage. For example, when a seed crystal in which the M-plane is formed through cleavage is used, then a high-quality nitride crystal can be produced at a high growth rate as compared with a case where a seed crystal having an unpolished M-plane or a seed crystal having a precision-polished M-plane is used for crystal growth.

The quality of the seed crystal is described. In a case of a seed crystal in which the C-plane is the major plane, preferably, the X-ray diffractiometry half-value width in reflection on the (0002) plane is at most 150 arcsec, more preferably at most 100 arcsec, even more preferably at most 50 arcsec. In a case of a seed crystal in which the M-plane is the major plane, preferably, the X-ray diffractiometry half-value width in reflection on the (10-10) plane is at most 150 arcsec, more preferably at most 100 arcsec, even more preferably at most 50 arcsec. Preferably, the threading dislocation density existing in the major plane is at most $1 \times 10^7/cm^2$, more preferably at most $1 \times 10^5/cm^2$, even more preferably at most $1 \times 10^3/cm^2$.

(Solvent)

In the invention, a nitrogen-containing solvent is used. The nitrogen-containing solvent may be a solvent not detracting from the stability of the nitride single crystal to be grown, concretely including ammonia, hydrazine, urea, amines (e.g., primary amines such as methylamine, secondary amines such as dimethylamine, tertiary amines such as trimethylamine, diamines such as ethylenediamine), melamine, etc. One or more of these solvents may be used here either singly or as combined.

Preferably, the amount of water and oxygen to be contained in the solvent for use in the invention is as small as possible, and preferably, the content of these is preferably at most 1000 ppm, more preferably at most 10 ppm, even more preferably at most 0.1 ppm. In case where ammonia is used as the solvent, its purity is generally at least 99.9% but preferably at least 99.99%, more preferably at least 99.999%, even more preferably at least 99.9999%.

(Starting Material)

The starting material for use in the invention contains an element that constitutes the nitride crystal to be grown on a seed crystal. For example, in a case where a nitride crystal of a Periodic Table Group 13 metal is desired to be grown, a starting material that contains the Periodic Table Group 13 metal is used. Preferred are a polycrystalline material of a Group 13 nitride crystal and/or a Group 13 element metal, and more preferred are gallium nitride and/or gallium. The polycrystalline material is not always required to be a complete nitride but may contain a metal component in which the Group 13 element is in a state of metal (zero-valent), if possible. For example, for the case where the crystal is gallium nitride, there is mentioned a mixture of gallium nitride and metal gallium.

The method for producing the polycrystalline material that may be used as the starting material in the invention is not specifically defined. For example, usable here is a polycrystalline nitride produced through reaction of a metal or its oxide or hydroxide with ammonia in a reactor where ammonia gas is kept running. As a metal compound material having higher reactivity, there may be used here halides, amide compounds, imide compounds, covalent-bonding M-N bond-having compounds such as galazan, etc. Also usable here is a polycrystalline nitride produced through reaction of a metal such as Ga or the like with nitrogen at high temperature and under high pressure.

The amount of water and oxygen to be contained in the polycrystalline material for use in the invention is as small as possible. The oxygen content in the polycrystalline material is generally at most 10000 ppm but preferably at most 1000 ppm, more preferably at most 1 ppm. Oxygen penetrability in the polycrystalline material has a relation to the reactivity with water of the material or to the water absorbability thereof. A polycrystalline material having a poorer crystallinity may have a larger amount of an active group such as an NH group and the like on the surface thereof, and the group may react with water thereby partially forming oxides or hydroxides. Accordingly, in general, the crystallinity of the polycrystalline material to be used here is preferably as high as possible. The crystallinity can be estimated based on the half-value width in X-ray diffractiometry, and the half-value width of the diffraction line at (100) (in hexagonal-type gallium nitride, 2θ=about 32.5°) is generally at 0.25° or less, preferably 0.20° or less, more preferably 0.17° or less.

(Reactor)

The production method of the invention is carried out in a reactor.

The reactor for use in the invention is selected from those resistant to high-temperature and high-pressure conditions for growth of nitride crystals. The reactor may be provided with a mechanism of controlling the pressure to be applied to the reactor and the contents therein from the outside thereof, as in JP-T 2003-511326 (WO01/024921) or JP-T 2007-509507 (WO2005/043638), or may also be an autoclave not having such a mechanism.

The "reactor" means a reaction chamber in which a nitride crystal is produced under the condition under which the supercritical-state and/or subcritical-state solvent can be kept in direct contact with the inner wall surface thereof, and as its preferred examples, there may be mentioned an inner structure itself of a pressure vessel and a capsule to be installed in a pressure vessel.

Preferably, the reactor for use in the invention is composed of a material having pressure resistance and corrosion resistance, and more preferably used here are an Ni-based alloy and a Co-based alloy such as Stellite (registered trade mark of Deloro Stellite Company Incorporated) and the like that are excellent in corrosion resistance to solvent such as ammonia, etc. Even more preferred is an Ni-based alloy, concretely including Inconel 625 (Inconel is a registered trade mark of Huntington Alloys Canada Limited—the same shall apply hereinunder), Nimonic 90 (Nimonic is a registered trade mark of Special Metals Wiggin Limited—the same shall apply hereinunder), RENE 41 (registered trade mark of Teledyne Allvac, Inc.), Inconel 718 (Inconel is a registered trade mark of Huntington Alloys Canada Limited), Hastelloy (registered trade mark of Haynes International, Inc.), Waspaloy (registered trade mark of United Technologies, Inc.).

The compositional ratio of these alloys may be suitably selected in accordance with the temperature and pressure conditions of the solvent in the system, and also with the reactivity thereof with the mineralizing agent to be contained in the system or with the reaction products of the agent and/or the oxidation/reduction powder thereof, and the pH condition. Though the corrosion resistance of the alloys to be used for the pressure-resistant reactor is high, the alloys do not always have high corrosion resistance enough to be such that the alloys do not have any influence at all on the quality of the crystal to be formed. In a supercritical solvent atmosphere, especially in such a severer corrosion environment that contains a mineralizing agent, the alloy may release its constituent ingredients of Ni, Cr, Fe and others and the alloying ingredients may be taken in the crystal to be formed. Therefore, in the invention, it is desirable that the reactor to be used is produced according to a method of directly lining or coating the inner surface of a pressure vessel with a material excellent in corrosion resistance for the purpose of preventing the inner surface corrosion of the pressure vessel, or a method of installing a capsule formed of a material excellent in corrosion resistance inside a pressure vessel.

Figure 2:
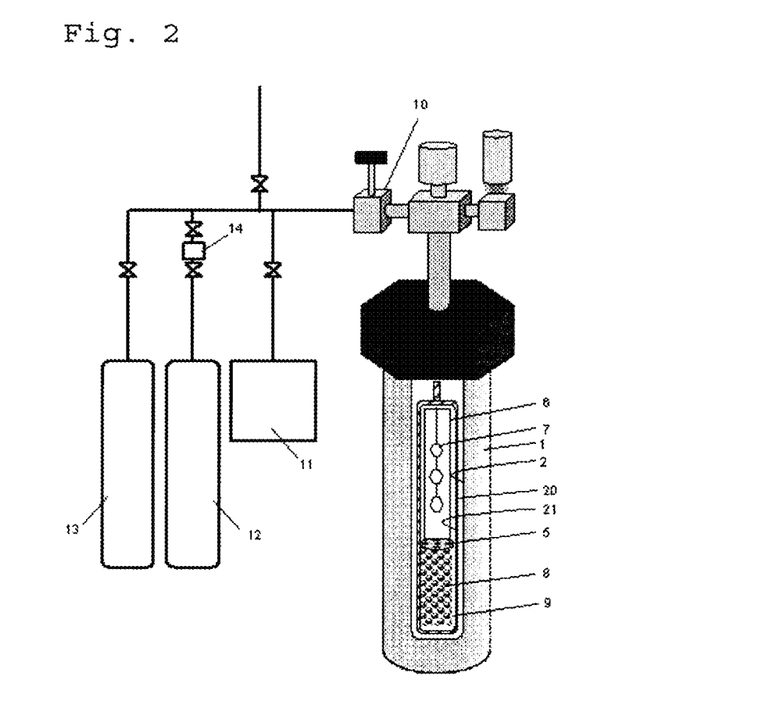
FIG. 2 is a schematic view of a crystal production apparatus usable in the invention.

FIG. 2 shows a specific example of a crystal production apparatus that contains a reactor usable for the production method of the invention. In this, the crystal is grown in the capsule 20 installed as a cylindrical vessel in the autoclave 1. The inner area of the capsule 20 is composed of a starting material melting region 9 to melt the starting material therein and a crystal growing region 6 to grow the crystal therein. In the starting material melting region 9, a solvent and a mineralizing agent may be put along with the starting material 8 therein, and in the crystal growing region 6, a seed crystal 7 may be arranged by hanging it with a wire therein. Between the starting material melting region 9 and the crystal growing region 6, a baffle plate 5 to partition the two regions is arranged. Preferably, the opening area of the baffle plate 5 is from 2 to 60%, more preferably from 3 to 40%. Preferably, the material of the surface of the baffle plate is the same as the material of the reactor, capsule 20. For enhancing the corrosion resistance thereof and for increasing the purity of the crystal to be grown in the reactor, preferably, the surface of the baffle plate is formed of Ni, Ta, Ti, Nb, Pd, Pt, Au, Ir or pBN, more preferably Pd, Pt, Au, Ir or pBN, even more preferably Pt. The crystal production apparatus of FIG. 2 is so designed that the space between the inner wall of the autoclave 1 and the capsule 20 could be filled with a second solvent. The space may be charged with nitrogen from the nitrogen gas cylinder 13 via the valve 10, or may be charged with ammonia as the second solvent from the ammonia cylinder 12 while the flow rate thereof is confirmed with the mass flow meter 14. Also, necessary pressure reduction may be made by means of a vacuum pump 11. The crystal production apparatus to be used in carrying out the production method of the invention does not always require a valve, a mass flow meter and a conduit pipe.

Figure 3:
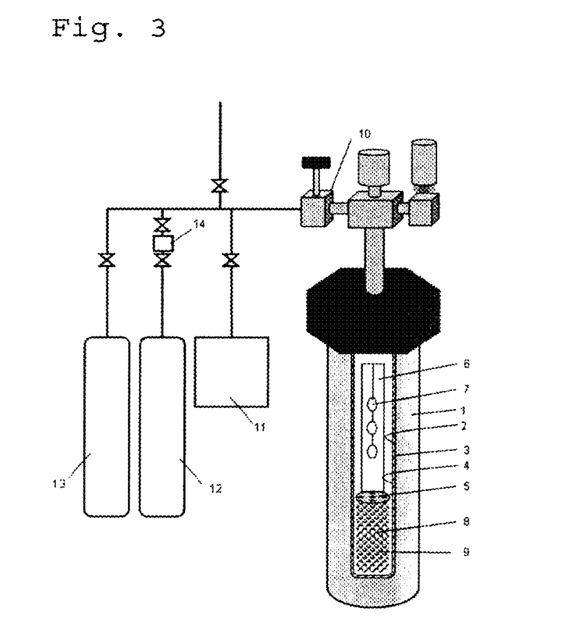

FIG. 3 shows a specific example of another crystal production apparatus usable for the production method of the invention. The crystal production apparatus does not use a capsule, and the crystal growth is attained in the autoclave therein.

For enhancing the corrosion resistance of the autoclave, the inner surface thereof may be lined or coated. Preferably, the lining material is at least one metal or element selected from noble metals including Pt, Ir, Pd, Rh and other platinum group metals and Ag and Au, and from Cu and C, or an alloy or a compound containing at least one metal, but more preferably at least one metal or element selected from Pt, Ag, Cu and C, or an alloy or a compound containing at least one metal, for the reason that lining with it is easy. For example, there are mentioned a Pt simple substance, a Pt—Ir alloy, an Ag simple substance, a Cu simple substance, graphite, etc.

(Production Step)

In carrying out the production method of the invention, first, a seed crystal, a nitrogen-containing solvent, a starting material and a mineralizing agent are put into the reactor and sealed up. Prior to introducing these materials into the reactor, the reactor may be degassed. In introducing the materials, an inert gas such as nitrogen gas or the like may be made to run in the reactor. In general, the seed crystal is charged in the reactor at the same time as or after charging with the starting material and the mineralizing agent. Preferably, the seed crystal is fixed to the tool made of the same noble metal as the noble metal of constituting the inner surface of the reactor. After the charging, if desired, the container may be degassed under heat.

In case where the production apparatus of FIG. 2 is used, a seed crystal, a nitrogen-containing solvent, a starting material and a mineralizing agent are put into the reactor, capsule 20, and sealed up, and then the capsule 20 is installed in the pressure vessel (autoclave) 1, and preferably, the space between the pressure vessel and the reactor is filled with a second solvent, and then the pressure vessel is sealed up.

Subsequently, the whole is heated so as to make the reactor vessel in a supercritical and/or subcritical state. In the supercritical state, in general, the viscosity of the reaction mixture in the reactor is low and the reaction mixture could be more readily diffused than liquid but has the same solvation power as that of liquid. Subcritical state means a state of a liquid that has nearly the same density as the critical density at around the critical temperature thereof. For example, in the starting material melting region to be charged with a starting material, the starting material charged therein is melted in a supercritical state, and in the crystal growing region, the temperature is changed so as to provide a subcritical state therein, and accordingly crystal growth is possible in the region by utilizing the solubility difference between the starting material in a supercritical state and that in a subcritical state.

In order to make it in a supercritical state, in general, the reaction mixture is kept at a temperature higher than the critical point of the solvent used. When an ammonia solvent is used, the critical point thereof is a critical temperature of 132° C. under a critical pressure of 11.35 MPa; however, in case where the filling rate to the volume of the reactor is high, the pressure may be much higher than the critical pressure even at a temperature lower than the critical temperature. In the invention, "supercritical state" includes a state where the pressure is higher than the critical pressure. The reaction mixture is sealed up in the reactor having a given volume, and therefore the temperature elevation increases the pressure of the fluid. In general, when T>Tc (critical temperature of one solvent) and P>Pc (critical pressure of one solvent), then the fluid could be in a supercritical state.

Under the supercritical condition, a nitride crystal can fully grow. The reaction time depends especially on the reactivity of the mineralizing agent used and on the thermodynamic parameters, or that is the values of the temperature and the pressure of the system. During production and growth of a nitride crystal, the pressure inside the reactor is preferably not lower than 120 MPa, more preferably not lower than 150 MPa, even more preferably not lower than 180 MPa. Also preferably, the pressure inside the reactor is not higher than 700 MPa, more preferably not higher than 500 MPa, even more preferably not higher than 350 MPa, still more preferably not higher than 300 MPa. The pressure can be suitably defined depending on the temperature and on the filling rate of the solvent volume to the volume of the reactor. Naturally, the pressure in the reactor is indiscriminately defined depending on the temperature and the filling rate therein, but in fact, varies in some degree depending on the starting material, the additives such as the mineralizing agent and the like, the temperature unevenness inside the reactor, and the presence of a free volume therein.

Regarding the temperature range in the reactor, the lower limit is preferably 500° C. or higher, more preferably 515° C. or higher, even more preferably 530° C. or higher, and the upper limit is preferably 700° C. or lower, more preferably 650° C. or lower, even more preferably 630° C. or lower. In the production method of the invention, preferably, the temperature in the starting material melting region inside the reactor is higher than the temperature in the crystal growing region therein. Preferably, the temperature difference between the starting material melting region and the crystal growing region ($|\Delta T|$) is at least 5° C., more preferably at least 10° C., and also preferably at most 100° C., more preferably at most 80° C. The optimum temperature and pressure inside the reactor may be suitably defined depending on the type and the amount of the mineralizing agent and other additives to be used in crystal growth therein.

The charging ratio, or that is the filling rate of the solvent in the reactor for attaining the above-mentioned temperature range and pressure range in the reactor may be generally from 20 to 95% but preferably from 30 to 80%, more preferably from 40 to 70%, based on the free volume of the reactor, or that is, in case where a polycrystalline starting material and a seed crystal are put in the reactor, the liquid density at the boiling point of the residual volume to be obtained by subtracting the volume of the seed crystal and that of the structure to hold the seed crystal from the volume of the reactor, and in case where a baffle plate is installed, that of the residual volume obtained by further subtracting the volume of the baffle plate from the volume of the reactor.

The nitride crystal in the reactor may be grown by heating the reactor by the use of an electric furnace having a thermocouple, and by keeping reactor in a subcritical state of a supercritical state of the solvent such as ammonia or the like in the reactor. The heating method and the heating rate up to the predetermined reaction temperature is not specifically defined, but in general, the reactor may be heated for from a few hours to a few days. If desired, a multi-stage heating mode may be employed, or the heating speed may be changed in the heating temperature range. Also if desired, the reactor may be heated with partial cooling.

The "reaction temperature" may be measured with a thermocouple arranged to be in contact with the outer surface of the reactor and/or a thermocouple inserted into the hole formed in a predetermined depth from the outer surface of the reactor, and from the found data, the internal temperature of the reactor could be estimated. The data measured with these thermocouples may be averaged to be the mean temperature of the reactor. In general, the temperature in the starting material melting region and the temperature in the crystal growing temperature may be averaged to give the mean temperature inside the reactor.

In the production method of the invention, the growth rate of the M-plane of the nitride crystal is preferably at least 100 µm/day, more preferably at least 120 µm/day, even more preferably at least 150 µm/day. Also preferably, the growth rate is at most 700 µm/day, more preferably at most 600 µm/day, even more preferably at most 500 µm/day.

In the production method of the invention, the growth rate of the A-plane of the nitride crystal is preferably at least 100 µm/day, more preferably at least 200 µm/day, even more preferably at least 300 µm/day. Also preferably, the growth rate is at most 2500 µm/day, more preferably at most 2000 µm/day, even more preferably at most 1600 µm/day.

Regarding the growth rate of the M-plane and the A-plane, the total growth rate of the two faces that are in the relation of the opposite sides of the same plane is defined as the growth rate of the M-plane and A-plane growth.

In case where the nitride crystal in the production method of the invention is a Periodic Table Group 13 metal nitride crystal, preferably, the growth rate of the Periodic Table Group 13 Metal plane is at least 10 µm/day, more preferably at least µm/day, even more preferably at least 30 µm/day. Also preferably, the growth rate is at most 100 µm/day, more preferably at most 90 µm/day, even more preferably at most 80 µm/day. In this, the growth rate of the M-plane is preferably at least 3 times the growth rate of the Periodic Table Group 13 metal plane, more preferably at least 4 times even more preferably at least 5 times.

In the production method of the invention, preferably, the growth rate of the nitrogen (N) plane of the nitride crystal is at least 100 µm/day, more preferably at least 200 µm/day, even more preferably at least 300 µm/day. Also preferably, the growth rate is preferably at most 1000 μm/day, more preferably at most 800 μm/day, even more preferably at most 600 μm/day.

In the production method of the invention, the growth rate of the N-plane of the nitride crystal is higher than the growth rate of the Group 13 metal plane thereof, and is from 5 times to 15 times the latter. The total of the growth rate of the N-plane and the growth rate of the Group 13 metal plane is defined as the growth rate of the C-plane growth (two sides).

Preferably, in the production method of the invention, the growth rate of the M-plane of the nitride crystal is at least 0.2 times the growth rate of the C-plane thereof, more preferably at least 0.3 times, even more preferably at least 0.4 times. Also preferably, the former is at most 1.5 times the latter, more preferably at most 1.2 times, even more preferably at most 0.9 times.

Preferably, in the production method of the invention, the growth rate of the A-plane of the nitride crystal is at least 0.5 times the growth rate of the C-plane thereof, more preferably at least 1.0 times, even more preferably at least 1.5 times. Also preferably, the former is at most 5.0 times the latter, more preferably at most 4.0 times, even more preferably at most 3.5 times.

The reaction time after having reached the predetermined temperature may vary depending on the type of the nitride crystal, the type of starting material and the mineralizing agent to be used, and the size and the amount of the crystal to be produced, but may be generally from a few hours to a few hundred days. During the reaction, the reaction temperature may be kept constant or may be gradually elevated or lowered. After the reaction time to form the desired crystal, the system is cooled. The cooling method is not specifically defined. For example, the heating with the heater may be stopped and the reactor may be cooled while left in the furnace, or the reactor may be taken out of the electric furnace and may be cooled in air. If desired, the reactor may be rapidly cooled with a coolant, and the mode is also preferred.

After the temperature of the outer surface of the reactor or the presumed temperature inside the reactor has reached a predetermined temperature, the reactor is opened. In this stage, the predetermined temperature is not specifically defined, but may be generally from −80° C. to 200° C., preferably from −33° C. to 100° C. In this, a duct may be connected to the duct connecting mouth of the valve attached to the reactor, and may be connected to a container filled with water or the like, and the valve may be opened. Further if desired, the system may be kept in vacuum to thereby fully remove the ammonia solvent from the reactor, and then the reactor may be dried and opened to take out the formed nitride crystal and the unreacted starting material and mineralizing agent and other additives.

In case where gallium nitride is produced according to the production method of the invention, JP-A 2009-263229 may be preferably referred to for the other details of the material, the production condition, the production apparatus and the step than those mentioned above. The entire contents of the disclosure in the patent publication are hereby incorporated in this description by reference.

(Nitride Crystal)

Preferably, the nitride crystal to be produced according to the production method of the invention is, for example, a Periodic Table Group 13 metal nitride crystal, more preferably a crystal of gallium nitride, aluminium nitride, indium nitride, or a mixed crystal of these, even more preferably a gallium nitride crystal. According to the production method of the invention, a nitride single crystal can be produced.

According to the production method of the invention, the halogen concentration in the nitride crystal produced can be suppressed low. For example, as compared with a nitride crystal produced according to an already-existing method of using a mineralizing agent that contains chlorine alone as the halogen element therein, the nitride crystal produced according to the production method of the invention of using a mineralizing agent that contains at least chlorine and fluorine has surprisingly but obviously a low chlorine concentration, and the chlorine concentration therein can be preferably at most 0.3 times that in the former, more preferably at most 0.01 times, even more preferably at most 0.001 times. Regarding the other halogen concentration therein, a nitride crystal also having s low bromine or iodine concentration can be produced according to the production method of the invention. Preferably, the fluorine concentration in the nitride crystal produced according to the production method of the invention is at most $1 \times 10^{18}$ atoms/cm$^{-3}$, more preferably at most $5 \times 10^{17}$ atoms/cm$^{-3}$, even more preferably at most $1 \times 10^{17}$ atoms/cm$^{-3}$. The fluorine concentration in the nitride crystal produced according to the production method of the invention is, for example, at least $5 \times 10^{15}$ atoms/cm$^{-3}$. The total concentration of chlorine, bromine and iodine in the nitride crystal produced according to the production method of the invention is at most $1 \times 10^{18}$ atoms/cm$^{-3}$, more preferably at most $1 \times 10^{17}$ atoms/cm$^{-3}$, even more preferably at most $1 \times 10^{16}$ atoms/cm$^{-3}$.

According to the production method of the invention, a flat but not needle-like nitride crystal can be produced. In particular, in the method, it is easy to produce a nitride crystal having an M-plane or an A-plane as the major plane thereof, also a large-sized and good-quality nitride crystal having a C-plane as the major plane thereof can be produced efficiently.

By suitably selecting the shape of the seed crystal to be used in carrying out the production method of the invention, a nitride crystal having a desired shape can be produced. For example, when a seed crystal having a C-plane is used in carrying out crystal growth according to the invention, a gallium nitride crystal having a large-caliber C-plane can be produced efficiently. Concretely, a gallium nitride crystal having an area of the C-plane of preferably at least 1 cm$^2$, more preferably at least 5 cm$^2$, even more preferably at least 10 cm$^2$ can be obtained. As another example, in carrying out crystal growth according to the invention using a seed crystal having an M-plane, a nitride crystal having a thickness in the m-axis direction can be obtained at a further high production efficiency. Concretely, a gallium nitride crystal having a thickness in the m-axial direction of preferably at least 100 μm, more preferably at least 500 μm, even more preferably at least 1 mm, still more preferably at least 5 mm can be obtained.

The nitride crystal produced according to the production method of the invention can be used directly as it is, or may be used after worked.

(Wafer)

Cutting out the nitride crystal of the invention in a desired direction gives a wafer having any desired crystal orientation (semiconductor substrate). Accordingly, there can be obtained a wafer having a polar plane such as a C-plane, a nonpolar plane such as an M-plane, or a semipolar plane such as (10-11) or (20-21) can be obtained. In particular, in case where a nitride crystal having a large-caliber C-plane is produced according to the production method of the invention, a large-caliber C-plane wafer can be obtained by cutting the crystal in the direction vertical to the c-axis thereof. In case where a nitride crystal having a thick and large-caliber M-plane is produced according to the production method of the invention, a large-caliber M-plane wafer can be obtained by cutting the crystal in the direction vertical to the m-axis thereof. In case where a nitride crystal having a large-caliber semipolar plane is produced according to the production method of the invention, a large-caliber semipolar-plane wafer can be obtained by cutting the crystal in the direction parallel to the semipolar plane thereof. These wafers are also characterized in that they are homogeneous and have a high quality. Using the thus-obtained wafer of the invention in desired epitaxial growth provides an epitaxial wafer.

(Device)

The nitride crystal and the wafer of the invention are favorably used for devices, or that is, for light-emitting devices or electronic devices. The light-emitting devices for which the nitride crystal and the wafer of the invention are favorably used include light-emitting diodes, laser diodes, and other light-emitting devices comprising a combination of the diode and a phosphor. As the electronic devices for which the nitride crystal and the wafer of the invention are usable, further mentioned are high-frequency devices, pressure-resistant high-power devices, etc. Examples of the high-frequency device include transistors (HEMT, HBT); and examples of the pressure-resistant high-power device include thyristors (IGBT). The nitride crystal and the wafer of the invention are characterized in that they are homogeneous and have a high quality, and therefore suitable for any of the above-mentioned applications. Above all, they are suitable for use for electronic devices that are especially required to have high homogeneousness.

EXAMPLES

The invention is described in more detail with reference to the following Examples and Comparative Examples. In the following Examples, the material used, its amount and ratio, the details of the treatment and the treatment process may be suitably modified or changed not overstepping the sprit and the scope of the invention. Accordingly, the invention should not be limitatively interpreted by the Examples mentioned below. In the following Examples, Reference Examples and Comparative Examples, the reaction apparatus shown in FIG. 2 was used to try growing a nitride crystal therein.

<Evaluation Method>

Analysis of Impurities in Nitride Crystal:

The nitride crystal was elementary-analyzed through SIMS for the halogen element therein. As the measuring apparatus, used was a secondary ion mass spectrometer. For reference, employed here was a crystal free from Br, I and F, as produced through HVPE for crystal growth in the absence of a halogen atom except chlorine.

Examples 1 to 15

In the following, the process of Example 2 is described in detail as a typical example.

A RENE 41-made autoclave 1 having an inner diameter of 30 mm and a length of 450 mm (inner capacity, about 345 cm$^3$) was used as a pressure vessel, in which a Pt—Ir-made capsule 20 was used as a reactor for crystal growth. The capsule was filled in a fully-dried nitrogen atmosphere globe box. As the starting material 8, 50.98 g of polycrystalline GaN particles were metered and set in the lower region of the capsule (starting material melting region 9). Next, as a mineralizing agent, $NH_4Cl$ having a purity of 99.999% and $GaF_3$ having a purity of 99.999%, both fully dried, were metered each in an amount of 6.0 mol % as the Cl concentration thereof and 0.5 mol % as the F concentration thereof, respectively, relative to the filling amount of $NH_3$, and put into the capsule.

Further, a platinum-made baffle plate 5 was arranged between the lower starting material melting region 9 and the upper crystal growing region 6. As the seed crystal 7, used were 2 sheets of wafer (10 mm×5 mm×0.3 mm) having, as the major plane thereof, a C-plane of a hexagonal-system GaN single crystal grown through HVPE, two sheets of wafer (5 mm×7.5 mm×0.3 mm) having an M-plane as the major plane thereof, and one granular crystal (about 5 mm×5 mm×5 mm) having formed through spontaneous nucleation in HVPE. The major plane of the seed crystal was CMP (chemical mechanical polishing)-finished except for the granular crystal, and it was confirmed that the surface roughness Rms, as measured with an atomic force microscope, was 0.5 nm. These seed crystals 7 were hung on a platinum-made seed crystal supporting frame via a metal wire having a diameter of 0.2 mm, and set in the upper crystal growing region 6 of the capsule.

Next, a Pt—Ir-made cover was TIG-welded to the top of the capsule 20, and then the weight was measured. A valve similar to the valve 10 in FIG. 2 was connected to the tube attached to the top of the cap, and the valve was controlled so as to communicate with the vacuum pump 11, via which the capsule was degassed in vacuum. Next, the valve was controlled so as to communicate with the nitrogen cylinder 13, by which the capsule was purged with a nitrogen gas. The degassification in vacuum and the nitrogen purging were attained five times each, and then while kept connected to the vacuum pump, the capsule was heated to remove moisture and adhering gas therefrom. The capsule was kept spontaneously cooled to room temperature, then the valve was closed, and while the vacuum state thereof was kept as such, the capsule was cooled with a dry ice/ethanol solvent. Subsequently, the valve of the duct was controlled so as to communicate with the $NH_3$ cylinder 12, then the valve was again opened and the capsule was charged with $NH_3$ not aired out. Based on flow rate control, $NH_3$ was charged into the capsule as a liquid corresponding to about 57% of the effective volume of the capsule (as computed in terms of the $NH_3$ density at −33° C.), and then the valve was again closed. The filling amount was confirmed from the difference between the weights before charging with $NH_3$ and after charging therewith.

Subsequently, the capsule 20 was inserted into the autoclave 1 equipped with the valve 10, then the autoclave 1 was closed and its weight was metered. Next, the valve 10 attached to the autoclave was controlled so that the duct could communicate with the vacuum pump 11, and the valve was opened for degassification in vacuum. Like the capsule, this was nitrogen-purged multiple times. Afterwards, while kept in vacuum, the autoclave 1 was cooled with a dry ice/methanol solvent, and the valve 10 was once closed. Next, the valve was again controlled so that the duct could communicate with the $NH_3$ cylinder 12, and then the valve 10 was again opened so that the autoclave 1 was charged with $NH_3$ while continuously protected from being aired out. Based on flow rate control, $NH_3$ was charged into the autoclave 1 as a liquid corresponding to about 59% of the effective volume (autoclave capacity—volume of filled matter) of the autoclave 1 (as computed in terms of the $NH_3$ density at −33° C.), and then the valve 10 was again closed. The temperature of the autoclave 1 was restored to room temperature, the outer surface thereof was fully dried, and the weight of the autoclave 1 was metered. The weight of $NH_3$ was computed from the difference between the weights before and after charging with $NH_3$, and the filling amount was thereby confirmed.

Subsequently, the autoclave 1 was set in an electric furnace composed of two-divided upper and lower heater sections. This was heated so that the temperature in the crystal growing region 6 of the outer surface of the autoclave could be 595° C., and the temperature in the starting material melting region 9 could be 625° C. (mean temperature, 610° C.), taking 9 hours, and then after the temperature reached the targeted level, this was kept at that temperature for 4.7 days. The inner pressure of the autoclave was 230 MPa. While kept at the preset temperature, the fluctuation in the autoclave outer surface control temperature was not more than ±0.3° C.

Afterwards, this was spontaneously cooled until the outer surface temperature of the autoclave 1 could be restored to room temperature, then the valve 10 attached to the autoclave was opened, and $NH_3$ in the autoclave was removed. Next, the autoclave 1 was weighed, and the $NH_3$ emission was thereby confirmed, and then the cover of the autoclave was opened and the capsule 20 was taken out. A hole was formed in the tube attached to the top of the capsule and $NH_3$ was removed from the capsule. The inside of the capsule was checked. As a result, a gallium nitride crystal was deposited uniformly on the entire surface of both the C-plane and the M-plane of the seed crystal. According to the process as above, a gallium nitride crystal of Example 2 was obtained. The growth rate differed in every plane direction, and was 43 μm/day on the Ga-plane, 247 μm/day on the N-plane, 54 μm/day on the M-plane and 213 μm/day on the A-plane.

In Examples 1 and 3 to 15, a gallium nitride crystal was deposited on the seed crystal according to the same process as in Example 2 except that the mineralizing agent concentration, the growing time (day), the temperature in the crystal growing region, the temperature in the starting material melting region and the pressure were changed as in Table 1. After the process of Examples 1 and 3 to 15, the inside of the capsule was checked, and in every case, a gallium nitride crystal was deposited uniformly on the entire surface of both the C-plane and the M-plane of the seed crystal.

The gallium nitride crystal growing on the seed crystal in Examples 1 to 15 was analyzed through X ray diffractiometry, and as a result, it was confirmed that the crystal was a hexagonal-system crystal not containing cubic crystal GaN. The growth rate is as shown in Table 1.

The Cl concentration in the gallium nitride crystal obtained in Example 2 in which the halogen elements in the mineralizing agent used were F and Cl, as measured through SIMS analysis, was $4 \times 10^{16}$ atoms/cm$^{-3}$. The Cl concentration was obviously lower than the Cl concentration, $8 \times 10^{18}$ atoms/cm$^{-3}$ in the gallium nitride crystal of Comparative Example 1 to be mentioned below, in which the halogen element in the mineralizing agent used was Cl alone. The Br concentration in the gallium nitride crystal obtained in Example 4, in which the halogen elements in the mineralizing agent used were F and Br, was low and was on the same level as that in HVPE crystal. The I concentration in the gallium nitride crystal obtained in Examples 5 to 15, in which the halogen elements in the mineralizing agent used were F and I, was low and was on the same level as that in HVPE crystal. The analytical values of F, Br and I are shown in Table 1 as the number of counts in SIMS, and as a reference sample (control), the found data of the crystal grown through HVPE are also shown therein. As compared with the data of the crystal grown through HVPE, the F concentration in the crystals obtained according to the invention was from $5 \times 10^{15}$ to $1 \times 10^{18}$ atoms/cm$^{-3}$, and the total concentration of Br and I was at most $1 \times 10^{18}$ atoms/cm$^{-3}$.

The concentration of F and I in the gallium nitride crystal in Example 5 was determined through quantitative SIMS analysis, and the F concentration was $2.1 \times 10^{17}$ atoms/cm$^{-3}$ and the I concentration was $2.4 \times 10^{15}$ atoms/cm$^{-3}$. The apparatus used for the SIMS analysis was CAMECA's secondary ion mass spectrometer (SIMS) IMS4f. The condition for analysis was as follows: The primary ion beam was Cs, the primary ion energy was 14.5 keV, and the secondary ion polarity was negative. The detection limit under the condition was $1 \times 10^{15}$ atoms/cm$^{-3}$ for the F concentration, and $2 \times 10^{15}$ atoms/cm$^{-3}$ for the I concentration.

The concentration of F and I in the gallium nitride crystal in Example 15 was determined through quantitative SIMS analysis, and the F concentration was $3.1 \times 10^{16}$ atoms/cm$^3$ and the I concentration was $2.9 \times 10^{15}$ atoms/cm$^3$. The apparatus used for the SIMS analysis was CAMECA's secondary ion mass spectrometer (SIMS) IMS4f. The condition for analysis was as follows: The primary ion beam was Cs, the primary ion energy was 14.5 keV, and the secondary ion polarity was negative. The detection limit under the condition was $3 \times 10^{14}$ atoms/cm$^3$ for the F concentration, and $3 \times 10^{15}$ atoms/cm$^3$ for the I concentration.

The half-value width in X-ray diffractiometry of the crystal grown on the C-plane of the seed crystal in Examples 1 to 15 was at most 50 arcsec as (0002) plane reflection and at most 30 arcsec as (10-12) plane reflection in every case; and the half-value width in X-ray diffractiometry of the crystal grown on the M-plane of the seed crystal was at most 30 arcsec as (10-10) plane reflection and at most 30 arcsec as (10-12) plane reflection in every case.

Reference Example 1

In Reference Example 1, deposition of a gallium nitride crystal on a seed crystal was tried according to the same process as in Example 2 mentioned above, except that the mineralizing agent concentration, the growing time (day), the temperature in the crystal growing region, the temperature in the starting material melting region and the pressure were changed as in Table 1. However, under the condition in Reference Example 1, the seed crystals were all melted, and therefore it was impossible to grow a gallium nitride crystal on the seed crystal. This indicates that, at the mineralizing agent concentration ratio in this case, the temperature dependence of the solubility of the starting material is negative. In the case of this ratio, the high-temperature region is the crystal growing region.

Comparative Examples 1 to 3

In Comparative Examples 1 to 3, a gallium nitride crystal was deposited on a seed crystal according to the same process as in Example 2 mentioned above, except that the mineralizing agent concentration, the growing time (day), the temperature in the crystal growing region, the temperature in the starting material melting region and the pressure were changed as in Table 1. The growth rate is as shown in Table 1.

In Comparative Example 1 in which Cl alone was used as the halogen element in the mineralizing agent, the growth rate on the M-plane and the A-plane was extremely low. In Comparative Example 2 in which F alone was used as the halogen element in the mineralizing agent, the temperature dependence of the solubility of the starting material was negative. Accordingly, in this, the seed crystal was set in the lower part (high-temperature region) of the reactor and the starting material was in the upper part (low-temperature region) of the reactor; however, 6.5% of the molten material deposited on the seed crystal, and there was much polycrystal deposition on the inner wall of the reactor and on the surface of the seed crystal supporting frame, and in this, therefore, the material efficiency was poor. In Comparative Example 3 in which I alone was used as the halogen element in the mineralizing agent, the growth rate in the N-plane direction was extremely low, and a crystal did not grow uniformly on the N-plane of the seed crystal but a large number of needle-like crystals grew in the c-axial direction. Any uniform crystal growth did not occur on the M-plane, and a large number of needle-like crystals having grown in the c-axial direction adhered to the plane. In addition, there occurred much polycrystal deposition on the inner wall of the reactor, and the material efficiency was poor. Further, the I concentration taken in the crystal was extremely high.

TABLE 1

| | Concentration of Mineralizing Agent (mol %) | | | | Concentration Ratio | Growth Rate (μm/day) | | | Growth Rate Ratio | | Growing Time | Mean Temperature | Pressure |
|---|---|---|---|---|---|---|---|---|---|---|---|---|---|
| | Cl | Br | I | F | F/(Cl, Br, I) | C (both planes) | M (both planes) | A (both planes) | M/C | A/C | (day) | (°C.) | (MPa) |
| Comparative Example 1 | 3 | | | | 0 | 325 | 37 | 73 | 0.11 | 0.22 | 14.7 | 609.5 | 250 |
| Example 1 | 3 | | | 0.05 | 0.017 | 350 | 38 | 217 | 0.11 | 0.62 | 4.9 | 610 | 245 |
| Example 2 | 6 | | | 0.5 | 0.083 | 290 | 54 | 213 | 0.19 | 0.73 | 4.7 | 610 | 230 |
| Example 3 | 3 | | | 0.25 | 0.083 | 297 | 77 | 338 | 0.26 | 1.14 | 5.7 | 610 | 250 |
| Reference Example 1 | 1.5 | | | 0.33 | 0.22 | Seed crystals all melted. | | | | | 4.0 | 610 | 240 |
| Example 4 | | 1 | | 0.5 | 0.5 | 246 | 102 | about 400 | 0.41 | 1.63 | 4.7 | 610 | 245 |
| Comparative Example 2 | | 1 | | | — | 275 | 254 | about 600 | 0.92 | 2.36 | 4.7 | 610 | 250 |
| Example 5 | | 0.75 | 0.375 | 0.5 | | 455 | 269 | 1070 | 0.59 | 2.35 | 4.8 | 602.5 | 230 |
| Example 6 | | 0.75 | 0.375 | 0.5 | | 439 | 354 | 1170 | 0.81 | 2.67 | 9.9 | 605 | 215 |
| Example 7 | | 1 | 0.25 | 0.25 | | 365 | 212 | 750 | 0.58 | 2.05 | 4.7 | 610 | 240 |
| Example 8 | | 1 | 0.5 | 0.5 | | 480 | 339 | about 1000 | 0.71 | 2.95 | 5.6 | 610 | 240 |
| Example 9 | | 1 | 1 | 1 | | 424 | 255 | 1150 | 0.60 | 2.71 | 4.7 | 610 | 240 |
| Example 10 | | 0.5 | 0.25 | 0.5 | | 288 | 169 | 990 | 0.59 | 3.44 | 4.5 | 602 | 235 |
| Example 11 | | 1 | 0.5 | 0.5 | | 650 | 327 | 1090 | 0.50 | 1.68 | 4.5 | 602.5 | 205 |
| Example 12 | | 1.5 | 0.75 | 0.5 | | 660 | 480 | 1640 | 0.73 | 2.48 | 9.8 | 612.5 | 215 |
| Example 13 | | 2 | 1 | 0.5 | | 338 | 180 | 1000 | 0.53 | 2.96 | 10 | 615 | 210 |
| Example 14 | | 3 | 1.5 | 0.5 | | 103 | 80 | 400 | 0.78 | 3.88 | 9 | 617.5 | 210 |
| Example 15 | | 1.2 | 0.6 | 0.5 | | 467 | 337 | 941 | 0.72 | 2.01 | 15.4 | 610 | 213 |
| Comparative Example 3 | | | 1 | 0 | | 1100 | 75 | 85 | 0.07 | 0.08 | 4.7 | 610 | 240 |

SIMS Reference Sample (crystal grown through HVPE)

| | Cl Concentration in Crystal (atoms/cm$^{-3}$) | Br Concentration in Crystal (counts) | I Concentration in Crystal (counts) | I Concentration in Crystal (atoms/cm$^{-3}$) | F Concentration in Crystal (counts) | F Concentration in Crystal (atoms/cm$^{-3}$) |
|---|---|---|---|---|---|---|
| Comparative Example 1 | $8 \times 10^{18}$ | | | | | |
| Example 1 | $1 \times 10^{18}$ | $1.4 \times 10^{0}$ | $5.2 \times 10^{1}$ | | $1.1 \times 10^{4}$ | |
| Example 2 | $4 \times 10^{16}$ | $1.2 \times 10^{0}$ | $5.6 \times 10^{1}$ | | $1.4 \times 10^{3}$ | |
| Example 3 | | | | | | |
| Reference Example 1 | | | | | | |
| Example 4 | $2 \times 10^{15}$ | $3.4 \times 10^{0}$ | $8.0 \times 10^{1}$ | | $3.6 \times 10^{2}$ | |
| Comparative Example 2 | $3 \times 10^{15}$ | $1.3 \times 10^{0}$ | $4.8 \times 10^{1}$ | | $7.2 \times 10^{1}$ | |
| Example 5 | | | | $2.4 \times 10^{15}$ | | $2.1 \times 10^{17}$ |
| Example 6 | | | | | | |
| Example 7 | | | | | | |
| Example 8 | $2 \times 10^{15}$ | $1.6 \times 10^{0}$ | $1.9 \times 10^{2}$ | | $5.2 \times 10^{2}$ | |
| Example 9 | | | | | | |
| Example 10 | | | | | | |
| Example 11 | | | | | | |
| Example 12 | | | | | | |
| Example 13 | | | | | | |
| Example 14 | | | | | | |
| Example 15 | | | | $2.9 \times 10^{15}$ | | $3.1 \times 10^{16}$ |
| Comparative Example 3 | $4 \times 10^{18}$ | | $1.8 \times 10^{6}$ | | | |
| SIMS Reference Sample (crystal grown through HVPE) | $1.3 \times 10^{15}$ | $1.3 \times 10^{0}$ | $6.9 \times 10^{1}$ | | $3.2 \times 10^{0}$ | |

Examples 101 to 104, and Comparative Example 101

In Example 101, F and Cl and Br were used as the halogen atoms in the mineralizing agent; in Example 102, F and Cl and I were used as the halogen elements in the mineralizing agent; in Example 103, F and Br and I were used as the halogen elements in the mineralizing agent; and in Example 104, F and Cl and Br and I were sued as the halogen elements in the mineralizing agent; and in these Examples, the same process as in Examples 1 to 15 mentioned above was carried out. As a result, in all these Examples, the same tendency as in the above-mentioned Examples 1 to 15 was confirmed. In other words, inside the capsule after the process of Examples 101 to 104, a gallium nitride crystal was uniformly deposited on the entire surface of the C-plane and the M-plane of every seed crystal. In addition, the gallium nitride crystal having grown on the seed crystals in Examples 101 to 104 were all hexagonal-system crystals not containing a cubic GaN. The growth rate in these Examples is similar to that of the Examples shown in Table 1. In Examples 101, 102 and 104, in which the mineralizing agent used contained multiple halogen elements including Cl, the Cl concentration on the Ga-plane and the M-plane of the formed gallium nitride crystal is greatly lowered than that in the gallium nitride crystal in the above-mentioned Comparative Example 1 in which Cl alone was sued as the halogen atom in the mineralizing agent. Regarding the case where the F concentration in the mineralizing agent is increased and the case where the concentration of the other halogen elements than F is increased, the tendency of the growth rate change in those cases is the same as the tendency thereof in the two-element systems with F+(Cl or Br or I). Regarding the influence of the halogen elements on the growth speed, the influence of I thereon is the largest and the influence of Br and Cl is smaller in that order.

In Comparative Example 101 where Br alone was used as the halogen element in the mineralizing agent, the same result was obtained as in Comparative Example 3 where I alone was used as the halogen element in the mineralizing agent.

INDUSTRIAL APPLICABILITY

According to the production method of the invention, a good-quality nitride crystal having, as the major plane thereof, an M-plane or A-plane, as well as a large-sized and good-quality nitride crystal having a C-plane as the major plane thereof can be produced efficiently. In addition, according to the production method of the invention, crystal growth is easier under lower temperature and pressure conditions than in a case where a mineralizing agent having fluorine alone as the halogen element therein is used, and therefore, the production method of the invention is more advantageous for producing a nitride crystal from the viewpoint of the process safety and the production cost. Further, according to the production method of the invention, the halogen concentration in the nitride crystal to be produced can be suppressed low. Therefore, the invention can provide a nitride crystal of gallium nitride or the like in a simplified manner, and the industrial applicability thereof is extremely excellent.

While the present invention has been described in detail and with reference to specific embodiments thereof, it will be apparent to one skilled in the art that various changes and modifications can be made therein without departing from the spirit and scope thereof.

The present disclosure relates to the subject matter contained in U.S. Provisional Patent Application No. 61/466,154, filed Mar. 22, 2011 and U.S. Provisional Patent Application No. 61/513,270, filed Jul. 29, 2011, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a gallium nitride crystal, comprising:
   placing in a reactor a starting material which comprises at least one of metal gallium and a nitride including gallium;
   placing a seed crystal in the reactor; and
   growing a gallium nitride crystal on a surface of the seed crystal in a presence of a nitrogen-containing solvent and a mineralizing agent,
   wherein the growing of the gallium nitride crystal comprises controlling a temperature and a pressure inside the reactor such that the nitrogen-containing solvent is in a supercritical state and/or a subcritical state, the mineralizing agent includes fluorine and at least one halogen element selected from the group consisting of chlorine, bromine and iodine, when the mineralizing agent includes chlorine and fluorine, a molar concentration of chlorine is at least 5 times a molar concentration of fluorine in the mineralizing agent, when the mineralizing agent includes bromine and fluorine, a molar concentration of bromine is at least 0.5 times a molar concentration of fluorine in the mineralizing agent, and when the mineralizing agent includes iodine and fluorine, a molar concentration of iodine is at least 0.5 times a molar concentration of fluorine in the mineralizing agent.

2. The method for producing a gallium nitride crystal of claim 1, wherein the mineralizing agent contains chlorine and fluorine.

3. The method for producing a gallium nitride crystal of claim 2, wherein the molar concentration of chlorine in the mineralizing agent is from 10 to 200 times the molar concentration of fluorine in the mineralizing agent.

4. The method for producing a gallium nitride crystal of claim 3, wherein a total molar amount of the at least one halogen element contained in the mineralizing agent is from 0.1 to 30 mol % of a molar amount of the nitrogen-containing solvent.

5. The method for producing a gallium nitride crystal of claim 1, wherein the mineralizing agent contains bromine and fluorine.

6. The method for producing a gallium nitride crystal of claim 5, wherein the molar concentration of bromine in the mineralizing agent is from 1 to 100 times the molar concentration of fluorine in the mineralizing agent.

7. The method for producing a gallium nitride crystal of claim 6, wherein a total molar amount of the at least one halogen element contained in the mineralizing agent is from 0.1 to 30 mol % of a molar amount of the nitrogen-containing solvent.

8. The method for producing a gallium nitride crystal of claim 1, wherein the mineralizing agent contains iodine and fluorine.

9. The method for producing a gallium nitride crystal of claim 8, wherein the molar concentration of iodine in the mineralizing agent is from 1 to 100 times the molar concentration of fluorine in the mineralizing agent.

10. The method for producing a gallium nitride crystal of claim 9, wherein a total molar amount of the at least one halogen element contained in the mineralizing agent is from 0.1 to 30 mol % of a molar amount of the nitrogen-containing solvent.

11. The method for producing a gallium nitride crystal of claim 1, wherein a total molar amount of the at least one halogen element contained in the mineralizing agent is from 0.1 to 30 mol % of a molar amount of the nitrogen-containing solvent.

12. The method for producing a gallium nitride crystal of claim 1, wherein the starting material is melted inside the reactor in a region having a temperature which is higher than a temperature of a region in which the gallium nitride crystal is grown on the surface of the seed crystal.

13. The method for producing a gallium nitride crystal of claim 1, wherein a temperature inside the reactor in the growing of the gallium nitride crystal is from 500 to 650° C.

14. The method for producing a gallium nitride crystal of claim 1, wherein the gallium nitride crystal is grown under a pressure of from 120 to 350 MPa.

15. The method for producing a gallium nitride crystal of claim 1, wherein a temperature inside the reactor in the growing of the gallium nitride crystal is from 500 to 530° C.

16. The method for producing a gallium nitride crystal of claim 1, wherein a temperature inside the reactor in the growing of the gallium nitride crystal is 500 to 515° C.

17. The method for producing a gallium nitride crystal of claim 1, wherein the gallium nitride crystal is grown under a pressure of from 150 to 300 MPa.

18. The method for producing a gallium nitride crystal of claim 1, wherein the starting material is gallium nitride.

* * * * *